United States Patent [19]

Kawanami et al.

[11] 4,107,472
[45] Aug. 15, 1978

[54] SEMICONDUCTOR CHANNEL SWITCH

[75] Inventors: Mitsuru Kawanami, Yokohama; Shinzi Okuhara, Fujisawa; Takuzi Mukaemachi, Yokohama, all of Japan

[73] Assignee: Hitachi, Ltd., Japan

[21] Appl. No.: 707,352

[22] Filed: Jul. 21, 1976

Related U.S. Application Data

[63] Continuation of Ser. No. 484,237, Jun. 28, 1974, abandoned.

[30] Foreign Application Priority Data

Jun. 29, 1973 [JP] Japan .................................. 48-72933

[51] Int. Cl.² ........................ H04Q 3/50; H04K 17/60
[52] U.S. Cl. ............................ 179/18 GF; 307/252 R; 307/247 R; 307/252 B; 340/166 R
[58] Field of Search ............... 307/252 B, 252 T, 247; 179/18 R, 18 GF, 18 A; 340/166 R

[56] References Cited

U.S. PATENT DOCUMENTS

| 3,542,963 | 11/1970 | Aagaard | 179/18 GF |
| 3,601,154 | 8/1971 | Potter | 179/18 GF |
| 3,688,051 | 8/1972 | Aagaard | 340/166 R |
| 3,760,361 | 9/1973 | Leger | 179/18 GF |
| 3,832,495 | 8/1974 | Hovagimyan | 179/18 GF |

OTHER PUBLICATIONS

D. C. Gate for Silicon Controlled Rectifiers, G. W. Allen et al., IBM Tech. Disclre. Blln. vol. 13, No. 6, 11/70.

Primary Examiner—Stanley D. Miller, Jr.
Assistant Examiner—B. P. Davis
Attorney, Agent, or Firm—Craig & Antonelli

[57] ABSTRACT

A plurality of PNPN switches, each permitting current flow in either, i.e., positive or negative, direction, are arranged at the cross points between the rows and the columns of the speech paths so as to form a matrix. The gate trigger terminal of each PNPN switch is connected with a gating current circuit having a high impedance, which circuit is adapted to control ON and OFF operations of the switch. A plurality of means are provided to selectively turn the gate current circuits on and off so that gate current is supplied continuously for the gate terminal of any desired PNPN switch at least for the time during which the corresponding cross point of the matrix is to be electrically bridged.

10 Claims, 3 Drawing Figures

SEMICONDUCTOR CHANNEL SWITCH

This is a continuation of application Ser. No. 484,237, filed June 28, 1974, now abandoned.

The present invention relates especially to the transistorization of a channel switch for use in a telephone exchange.

Most of the attempts which have hitherto been made to transistorize the channel switch used in a telephone exchange, resort to the use of PNPN switches (referred to as thyristors or SCR's). A PNPN switch has a comparatively low impedance in its conducting state and a high insulating resistance in the cut-off state, and moreover, once it is turned on even with a small gate signal, it remains conductive until the load or main current is interrupted, that is, the switch has a self-holding action. Hence, such a PNPN switch is very useful if it is used as an electronic device in the electronic speech path of a telephone exchange. With a telephone exchange, however, since the ringing (bell signal) is in the form of a high a.c. voltage, the speech path must permit current to flow in either a positive or negative direction, and since the current is usually interrupted by the dialing and hooking operations, the channel switch must be closed even during these operations. Accordingly, the self-holding action of the PNPN switch cannot be fully utilized in this sort of application and in the past, dialing and ringing signals have been separately treated while only a speech signal (small signal) superposed upon a d.c. signal has been processed by the PNPN switch.

It is therefore one object of the present invention to provide a semiconductor channel switch which can directly treat the speech signal, dialing and hooking signals, and a ringing signal together.

Other objects, features and advantages of the present invention will be apparent when one reads the following description of the preferred embodiments in conjunction with the accompanying drawings, in which.

Figure 1:
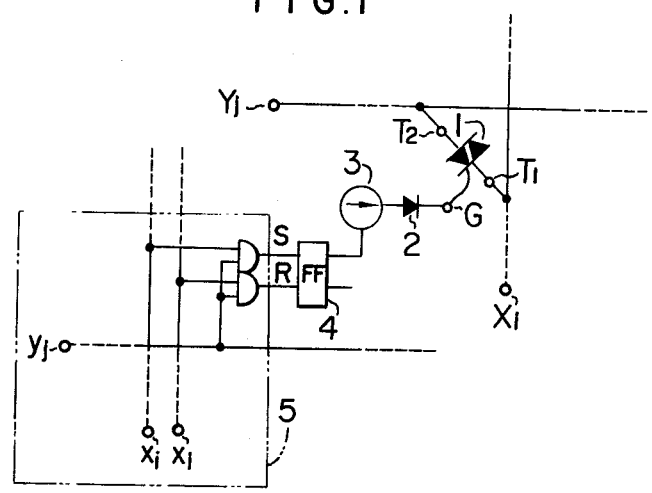
FIG. 1 shows the structure of a basic unit of a first embodiment of the present invention.

In FIG. 1 showing a basic structure of a semiconductor channel switch as one embodiment of the present invention, a gate control type bidirectional PNPN switch 1 has its main terminals $T_1$ and $T_2$ connected respectively with speech paths $X_i$ and $Y_j$ and is disposed at a cross point of a row and a column of a channel matrix as well as each of the other PNPN switches (not shown) is disposed at each cross point thereof. The gate terminal G of the switch 1 is connected through a diode 2 for preventing reverse current flow with a gate current circuit 3 having a high impedance with respect to alternating current. The diode 2 may be omitted if the gate current circuit itself 3 is provided with a means to block the reverse current. The gate current circuit 3 is controlled by a memory 4, which is set and reset by a cross-point selecting circuit 5. In the embodiment shown in FIG. 1, the memory 4 is a flip-flop and the cross-point selecting circuit 5 is a circuit which can set or reset the memory 4 in accordance with the logical product of the signals on select channels $x_i$ and $y_j$ or $x_i$ and $y_j$. When pulse signals appear simultaneously on the select channels $x_i$ and $y_j$, the memory 4 is set so that the gate current circuit 3 starts continuously delivering a gating current to turn on the switch 1. If the memory 4 is reset according to the logical product of the signals on the select channels $x_i$ and $y_j$, the gate current circuit 3 stops supplying the gating current. However, the switch 1 must be opened by another artifice since it has a self-holding action as described above. In most practical cases, the speech current is interrupted by the hook switch of a telephone unit upon completion of conversation, and no special control is needed. The unit structures as described above, one of which is shown in FIG. 1, are combined in the form of an $m \times n$ matrix with each pair of incoming and outgoing speech paths wired in the form of a balanced circuit.

The respective elements of the structure shown in FIG. 1 will now be described in further detail.

The gate controlled type bidirectional PNPN switch refers to one which has a control gate terminal and permits the bidirectional flows of current and a switch called "triac" is a typical example thereof. The same function can also be obtained by a pair of ordinary PNPN switches connected in antiparallel configuration. The exclusive use of the PNPN switch is due to the fact that it has an advantage of low conduction impedance and high insulating resistance as mentioned above, that it has a much better characteristic superior to a transistor or other elements since it has a high breakdown voltage against current in either direction when it is used in the circuit of the present invention in which alternating current as well as direct current is treated, and that its self-holding action can be utilized, as described later, for a certain distribution of potentials on the speech channels.

The reason why a memory means such as memory 4 is provided even though the switch is provided with a self-holding action, is that the gate current circuit 3 must always be in operation so as to immediately supply current for speech paths without receiving pulses again from the select channel when the speech paths are restored even in case where switch 1 is turned off when the channel current temporarily becomes zero due to hooking or dialing or due to the instantaneous disappearance of current as in an alternating current.

The purpose of the gate current circuit 3 having a high impedance is to prevent the speech signal from leaking out through gate G or into another circuit during a conversation in which circuit 3 is in operation and the amplitude or variation of the value of the gating current causes no problem if it is large enough to actuate the switch. In general, a simply designed constant-current circuit will suffice for the purpose.

The cross-point selecting circuit 5 may be designed so as to be set and reset by another selecting circuit, as in the embodiment shown in FIG. 1, or to be automatically reset when any other cross-point is selected, depending upon the purpose of the channel switches. The gate current circuit 3 and the memory 4 are provided for each cross-point while a part of the cross-point selecting circuit 5 may be commonly used for a matrix of the speech paths.

In a circuit using the commercial a.c. supply, a pulsating gating current in synchronism with the alternating current may be usually supplied for the bidirectional PNPN switch. However, since the bell signal or the dialing and hooking signals are usually asynchronous with the alternating current or take place unexpectedly, the control circuit which performs the pulse control by continuously supervising these signals must be necessarily provided in a complicated circuit configuration and therefore not effective.

When the memory 4 is set and the PNPN switch 1 becomes conductive, the potentials at the channels $X_i$ and $Y_j$ sometimes exceed the upper limit voltage obtainable by the gate current circuit 3. This condition will occur if the terminals $X_i$ and $Y_j$ are connected respectively with a high positive voltage source and a load resistance. In this case, the conduction between the terminals $X_i$ and $Y_j$ is maintained only through the self-holding action of the switch 1 and the gating current is substantially zero although the gate current circuit 3 is at operation and in a limiting case the reverse current would flow without the diode 2. However, it is possible for the gate current to flow immediately if the PNPN switch 1 is turned off for some cause or other. Therefore, in this specification, the meaning of "to cause the gating current to flow continuously" invovles the state where the circuit 3 is operating to supply the gating current though the gating current cannot flow actually.

Figure 2:
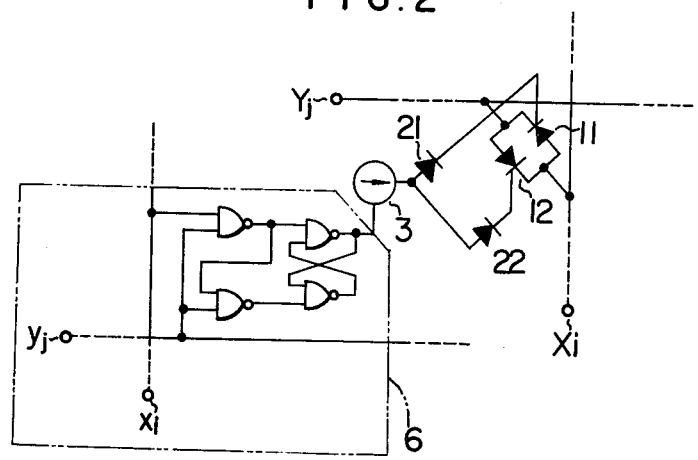
FIG. 2 shows the structure of a basic unit of a second embodiment of the present invention.

FIG. 2 shows the structure of a basic unit of a semiconductor channel switch as a second embodiment of the present invention, the basic unit being associated with a cross-point of the channel switch, as described with FIG. 1. In FIG. 2, ordinary PNPN switches 11 and 12, each having a gate control terminal, are connected in antiparallel configuration with each other to form a bidirectional PNPN switch. Diodes 21 and 22 are connected with the respective gate terminals of the PNPN switches 11 and 12 to prevent the reverse current. A gate current circuit 3 shown here is the same as that shown in FIG. 1 but the memory 4 and the cross-point selecting circuit 5 are replaced by a set-preference flip-flop 6. With this structure, when pulse signals appear simultaneously on the select channels $x_i$ and $y_j$, the set-preference flip-flop 6 is set so that the gate current circuit 3 starts delivering continuous gating current to turn on the switches 11 and 12. When a pulse signal again appears on the select channel $y_j$ for the selection of another cross-point, the set-preference flip-flop 6 is reset. This circuit configuration shown in FIG. 2 needs no select channel for reset (corresponding to the channel $x_i$ in FIG. 1) and therefore has an advantage that the number of the select channels is comparatively small for its capacity, so that the structure is very useful for use in a semiconductor channel switch of an electronic telephone exchange. These unit structures, one of which is shown in FIG. 2, are combined in the form of an $m \times n$ matrix with each pair of an incoming and an outgoing speech paths in the form of a balanced circuit.

Figure 3:
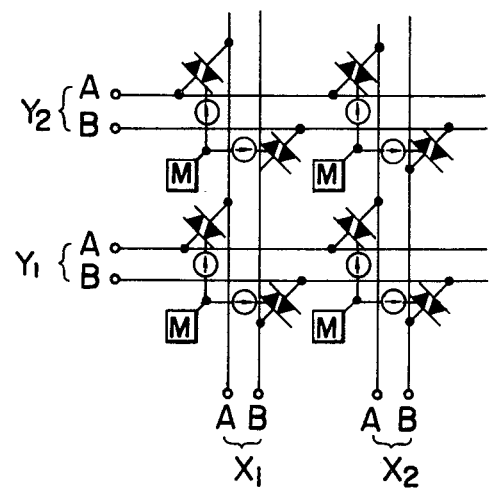
FIG. 3 shows a structure of a 2 × 2 balanced type switch fabricated according to the present invention.

FIG. 3 shows a case where the unit structures according to the present invention are wired in the form of a balanced type $2 \times 2$ matrix. In FIG. 3, the cross-point selecting circuit, etc., are omitted for the simplicity of the figure. As shown in FIG. 3, the channel switch is usually constructed in the form of an $m \times n$ matrix with each pair of an incoming and an outgoing paths (line A and line B) wired in a balanced circuit. In this case, a memory M has to be provided for each cross-point but since the potentials at the lines A and B are different from each other, two separate gate current circuits must be provided respectively for the lines A and B.

As described above, the semiconductor channel switch according to the present invention can treat, in the same manner as the conventional mechanical channel switch does, the ringing, dialing and hooking signals together with the speech signal.

Moreover, in the above embodiments, it is assumed that the PNPN switch is turned on by feeding current into the gate, but if it is desired to turn on the switch by drawing current from the gate, it is only necessary to invert the senses of the gate current circuit and the associated diodes. Further, each of such elements need not be in the form of an integrally fabricated part but has only to be composed of discrete parts connected with one another by wires.

What we claim is:

1. A semiconductor channel switch comprising:
a pair of PNPN switches having gate terminals and a self-holding action and connected to each other in anti-parallel configuration;
gate current circuit means including a gate current circuit for operatively providing a constant current to the gate terminals of said pair switches during its ON state and means for preventing reverse current flow in the circuit of said gate terminals, said gate current circuit means having high impedance and controlled to the ON or OFF state;
control means connected to the gate current circuit for operatively rendering the corresponding gate current circuit into the ON state; and
selecting means connected to the control means for selectively rendering said control means into its operative or inoperative state.

2. A semiconductor channel switch according to claim 1 wherein said control means comprises a set-preference flip-flop circuit being rendered into a set or reset state whether pulse signals from said sources are supplied thereto concurrently or not, respectively.

3. A semiconductor channel switch for connecting two points between which a communication path is to be established comprising:
gate control type PNPN switch means comprising a pair of PNPN switches each having a gate terminal and a self-holding action and connected in anti-parallel configuration, said PNPN switch means being connected between said two points for permitting currents to flow in both directions therethrough;
gate current circuit means including a gate circuit for operatively providing a constant current connected to the gate terminals of corresponding ones of said pair of PNPN switch means and having a high impedance, said gate current circuit means being controlled to an ON or OFF state for operatively providing a constant current to the gate terminals of the corresponding pair of PNPN switches during its ON state;
memory circuit means connected to said gate current circuit means and controlled to a set or reset state for maintaining said gate current circuit means in the ON or OFF state in accordance with its set or reset state, respectively; and
selecting circuit means for setting and resetting said memory circuit.

4. A semiconductor channel switch according to claim 3, wherein said gate current circuit means comprises a pair of diodes and a gate current circuit, two gate terminals of said pair of PNPN switches being connected with the terminals of one polarity of the pair of diodes respectively, the terminals of the other polarity of the pair of diodes being connected with each other and connected with said gate current circuit, which circuit is in turn connected with said selecting circuit means so as to be controlled to the ON or OFF state.

5. A semiconductor channel switch according to claim 3, wherein said gate current circuit means causes currents to flow in the circuit of the gate terminals in only one direction and prevents current flow in the opposite direction.

6. A semiconductor channel switch comprising:
plural pairs of PNPN switches having gate terminals and a self-holding action, the PNPN switches in each pair being connected to each other in anti-parallel configuration;
plural pairs of diodes;
a plurality of gate current circuits each connected to each pair of PNPN switches for providing a constant current to the gate terminals of the corresponding pair of the switches, said gate current circuits having high output impedance and being controlled to an ON or OFF state;
a plurality of memory circuits for maintaining said gate circuits in their ON or OFF state; and
selecting circuits for setting and resetting said memory circuits, each pair of PNPN switches being disposed at the cross-points of speech paths, two gate terminals of each pair of PNPN switches being connected with the terminals of one polarity of the diodes of each pair of diodes respectively, the terminals of the other polarity of the diodes being connected with each other and multiply connected with an output terminal of one of said gate current circuits, an input terminal of each gate current circuit being connected with an outut terminal of one of said memory circuits and each memory circuit being connected with an output terminal of said selecting circuit.

7. A semiconductor channel switch comprising: plural pairs of PNPN switches having gate terminals and a self-holding action, the PNPN switches in each pair being connected to each other in anti-parallel configuration; plural pairs of diodes; a plurality of gate current circuits for providing a constant current to the gate terminals of the corresponding pair of the switches, said gate current circuits having high output impedance and being controlled to an ON or OFF state; a plurality of set-preference flip-flop circuits each connected to each of said gate current circuits for operatively rendering the corresponding gate current circuits in their ON or OFF state; and selecting circuit means for selectively supplying two control signals either concurrently or not so that each said flip-flop circuit is rendered in the set or reset state in response to whether the two control signals are applied concurrently or not, respectively, wherein said plural pairs of PNPN switches being disposed at the cross-points of speech paths, two gate terminals of each pair of PNPN switches being connected with the terminals of one polarity of the diodes of each pair of diodes, respectively, the terminals of the other polarity of the diodes being connected with each other and multiply connected with each of said set-preference flip-flop circuits.

8. A semiconductor channel switch arranged in speech paths formed as incoming and outgoing lines (lines A and B) which are wired in balanced circuits and arranged in a matrix having rows and columns, comprising: plural pairs of PNPN switches having gate terminals and a self-holding action connected in anti-parallel configuration; plural pairs of diodes; gate current circuits; said diodes in each pair multiply connecting gates of each pair of PNPN switches with the gate current circuit, one of said PNPN switch pairs being connected between the row channel line A and the column channel line A and another being connected between the row channel line B and the column channel line B, at the cross-points of the row and column channels, said gate current circuit providing a constant current, said gate current circuits having a high output impedance and controlled to ON/OFF states; and a memory circuit having on ON or OFF state and provided commonly with two gate current circuits which are connected with plural pairs of PNPN switches disposed at said cross-points so as to maintain said gate current circuits in their ON or OFF states, said speech paths at said cross-points of said row and column lines being opened or closed by controlling the On or OFF state of said memory circuit.

9. A semiconductor channel switch comprising plural pairs of PNPN switches having gate terminals and a self-holding action connected in anti-parallel configuration, plural pairs of diodes for multiply connecting gates of each pair of PNPN switches with a gate current circuit, said PNPN switch pairs being connected between two points between which a path is to be established, said gate current circuit providing a constant current and having a high output impedance and being controlled to ON and OFF operation states, a memory circuit for maintaining said gate current circuit in the ON and OFF states; and a selecting circuit for setting and resetting said memory circuit, said gate current circuit being controlled in its ON and OFF operation states in accordance with the set and reset operation of said selecting circuit, respectively, so that said speech path is opened and closed.

10. A semiconductor channel switch comprising:
plural pairs of PNPN switches having gate terminals and a self-holding action, the PNPN switches in each pair being connected to each other in anti-parallel configuration;
plural pairs of diodes;
a plurality of gate current circuits for providing a constant current to the gate terminals of a corresponding pair of the switches;
a plurality of memory circuits for maintaining said gate circuits in their ON or OFF state; and
selecting circuits for setting and resetting said memory circuits;
each pair of PNPN switches being disposed at the cross-points of speech paths, two gate terminals of each pair of PNPN switches being connected with the terminals of one polarity of the diodes of each pair of diodes respectively, the terminals of the other polarity of the diodes being connected with each other and multiply connected with an output terminal of one of said gate current circuits, said constant current being continuously derived from an output terminal of each gate current circuit when each gate current circuit is switched on through each memory circuit by pulse signals applied to an input terminal of each said selecting circuit, and said gate current circuit having a high out impedance.

* * * * *